(12) United States Patent
Guo et al.

(10) Patent No.: US 8,453,075 B2
(45) Date of Patent: May 28, 2013

(54) AUTOMATED LITHOGRAPHIC HOT SPOT DETECTION EMPLOYING UNSUPERVISED TOPOLOGICAL IMAGE CATEGORIZATION

(75) Inventors: Wei Guo, Fishkill, NY (US); Alan J. Leslie, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/224,402

(22) Filed: Sep. 2, 2011

(65) Prior Publication Data

US 2013/0061184 A1     Mar. 7, 2013

(51) Int. Cl.
*G06F 17/50*     (2006.01)

(52) U.S. Cl.
USPC ............. 716/52; 716/56; 716/119; 716/132

(58) Field of Classification Search
None
See application file for complete search history.

(56) References Cited

U.S. PATENT DOCUMENTS

| | | | |
|---|---|---|---|
| 6,425,113 B1 | 7/2002 | Anderson et al. | |
| 6,711,293 B1 * | 3/2004 | Lowe | 382/219 |
| 7,135,344 B2 | 11/2006 | Nehmadi et al. | |
| 7,568,179 B1 * | 7/2009 | Kroyan et al. | 716/51 |
| 7,570,800 B2 | 8/2009 | Lin et al. | |
| 7,685,558 B2 * | 3/2010 | Lai et al. | 716/51 |
| 7,725,845 B1 | 5/2010 | White et al. | |
| 7,729,529 B2 | 6/2010 | Wu et al. | |
| 7,805,692 B2 | 9/2010 | Jeng | |
| 7,823,099 B2 | 10/2010 | Tsai et al. | |
| 7,853,920 B2 | 12/2010 | Preil et al. | |
| 8,302,052 B2 * | 10/2012 | Lee et al. | 716/112 |
| 2007/0266362 A1 | 11/2007 | Lai et al. | |
| 2008/0298669 A1 | 12/2008 | Funakoshi et al. | |

OTHER PUBLICATIONS

Lowe, "Object Recognition from Local Scale-Invariant Features," Proceedings of the Seventh IEEE Int'l Conference on Computer Vision, 1999, pp. 1150-1157.*

* cited by examiner

*Primary Examiner* — Leigh Garbowski
(74) *Attorney, Agent, or Firm* — Scully, Scott, Murphy & Presser, P.C.; Wenjie Li

(57) ABSTRACT

A method for proactively preventing lithographic problems is disclosed, which employs information generated from layout patterns including hot spots in a first technology node to identify hot spots in a second technology node employing a scaled down minimum dimension. In this proactive approach, problematic patterns or complex product geometries are identified in a chip design layout of the second technology node based on detection, in the chip design layout, of topological features that are similar to topological features of known hot spots in the first technology node. The identified patterns are potential hot spots in the chip design layout for the second technology node. Known hot spots in layout patterns in the first technology node are topologically categorized to provide a database for performing the fault detection and diagnosis on the chip design layout.

20 Claims, 7 Drawing Sheets

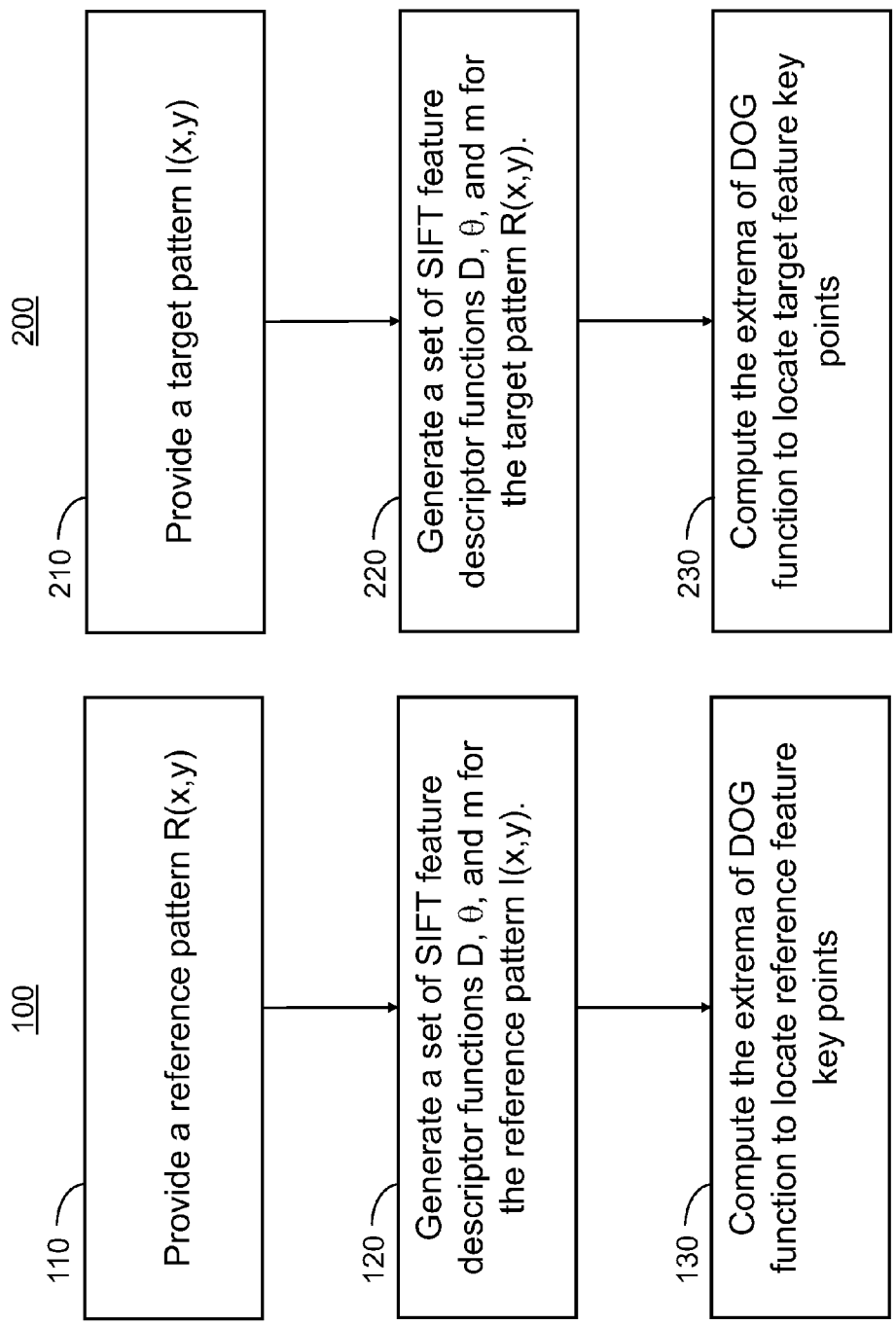

AUTOMATED LITHOGRAPHIC HOT SPOT DETECTION EMPLOYING UNSUPERVISED TOPOLOGICAL IMAGE CATEGORIZATION

BACKGROUND

The present disclosure generally relates to chip design methods for semiconductor chips, and particularly to methods of identifying lithographic hot spots in a chip design layout and a system for implementing the same.

A chip design layout for a semiconductor chip includes multiple layout patterns having various levels of lithographic printability. Some layout patterns may be robust enough to be ported into another chip design layout employing a reduced minimum dimension. For example, some layout patterns for the 45 nm technology node may have a high level of printability to enable shrinking of the layout pattern for the 32 nm technology node without modification. However, some other layout patterns may exacerbate an existing printability problem if ported to a technology node employing a reduced minimum dimension. Particularly, a layout pattern that is known to have limited printability at one technology node would present severe printability problems if ported to another technology node employing a reduced minimum dimension.

A layout pattern attributed with limited printability at a technology node is referred to as a "lithographic hot spot" or "hot spot." A hot spot potentially or factually causes printability problems or yield problems. Identification of hot spots and taking measures to overcome the adverse effects of the hot spots is a key procedure to ensure successful manufacturability and fabrication yield. Measures to overcome the adverse effects may be modification of the design layout and/or modification of lithographic processes to maximize the processing window at corresponding lithography steps.

Because scaling of dimensions typically aggravate printing problems for hot spots, the printability or yield problems seen in hot spots in a design layout in a technology node is repeated in the next technology node employing reduced dimensions. While identical layout patterns employing different minimum dimensions, i.e., direct "shrinks" of prior layout patterns, can be easily identified, most design layouts are modified from one generation to the next. Thus, knowledge gained by analysis of hot spots in one technology node is difficult to transfer to the next technology node.

Currently, the printability or yield problems are identified and fixed only within the same technology node. Further, predicting the printability potentially problematic patterns or structures becomes more difficult in the area of computational lithography due to the ever decreasing design scales, variability of design patterns, and the corresponding process variations. Thus, the information on the pattern of hot spots as generated in one technology node is difficult to transfer to the next technology node.

BRIEF SUMMARY

A method for proactively preventing lithographic problems is disclosed, which employs information generated from layout patterns including hot spots in a first technology node to identify hot spots in a second technology node employing a scaled down minimum dimension. In this proactive approach, problematic patterns or complex product geometries are identified in a chip design layout of the second technology node based on detection, in the chip design layout, of topological features that are similar to topological features of known hot spots in the first technology node. The identified patterns are potential hot spots in the chip design layout for the second technology node, and resources for lithographic image enhancement can be prioritized to resolve the lithographic issues at the potential hot spots in the design layout. To proactively identify potential hot spots and to allocate resources to enhance printability of layout patterns including potential hot spots, the design data from the chip design layout is linked to a program for performing fault detection and diagnosis on the chip design layout. Known hot spots in layout patterns in the first technology node are topologically categorized to provide a database for performing the fault detection and diagnosis on the chip design layout.

According to an aspect of the present disclosure, a method of identifying lithographic hot spots in a chip design layout is provided. The method includes: generating a set of reference feature key points by performing, employing at least one computing means, a first scale invariant feature transformation (SIFT) on a reference pattern including a lithographic hot spot and located in a first chip design layout; generating a set of target feature key points by performing, employing the at least one computing means, a second SIFT on a target pattern located in a second chip design layout; matching the set of reference feature key points with the set of target feature key points by identifying, employing the at least one computing means, pairs of feature key points across the set of reference feature key points and the set of target feature key points, wherein each of the pairs are selected to provide maximum matching between topological features of the set of reference feature key points and topological features of the set of target feature key points; and storing data representing a result of the matching in a non-transitory machine readable data storage medium employing the at least one computing means, wherein the stored data represents presence of at least one lithographic hot spot in the target pattern.

According to another aspect of the present disclosure, a system for identifying lithographic hot spots in a chip design layout is provided. The system includes at least one computing means including a processor. The at least one computing means is configured to perform the steps of: generating a set of reference feature key points by performing a first scale invariant feature transformation (SIFT) on a reference pattern including a lithographic hot spot and located in a first chip design layout; generating a set of target feature key points by performing a second SIFT on a target pattern located in a second chip design layout; matching the set of reference feature key points with the set of target feature key points by identifying pairs of feature key points across the set of reference feature key points and the set of target feature key points, wherein each of the pairs are selected to provide maximum matching between topological features of the set of reference feature key points and topological features of the set of target feature key points; and storing data representing a result of the matching in a non-transitory machine readable data storage medium, wherein the stored data represents presence of at least one lithographic hot spot in the target pattern.

BRIEF DESCRIPTION OF THE SEVERAL VIEWS OF THE DRAWINGS

FIG. 2 is a flow chart illustrating the method for formalizing scale invariant feature transformation (SIFT) features on a reference pattern.

FIG. 3 is a flow chart illustrating the method for formalizing SIFT features on a target pattern.

DETAILED DESCRIPTION

Figure 1:
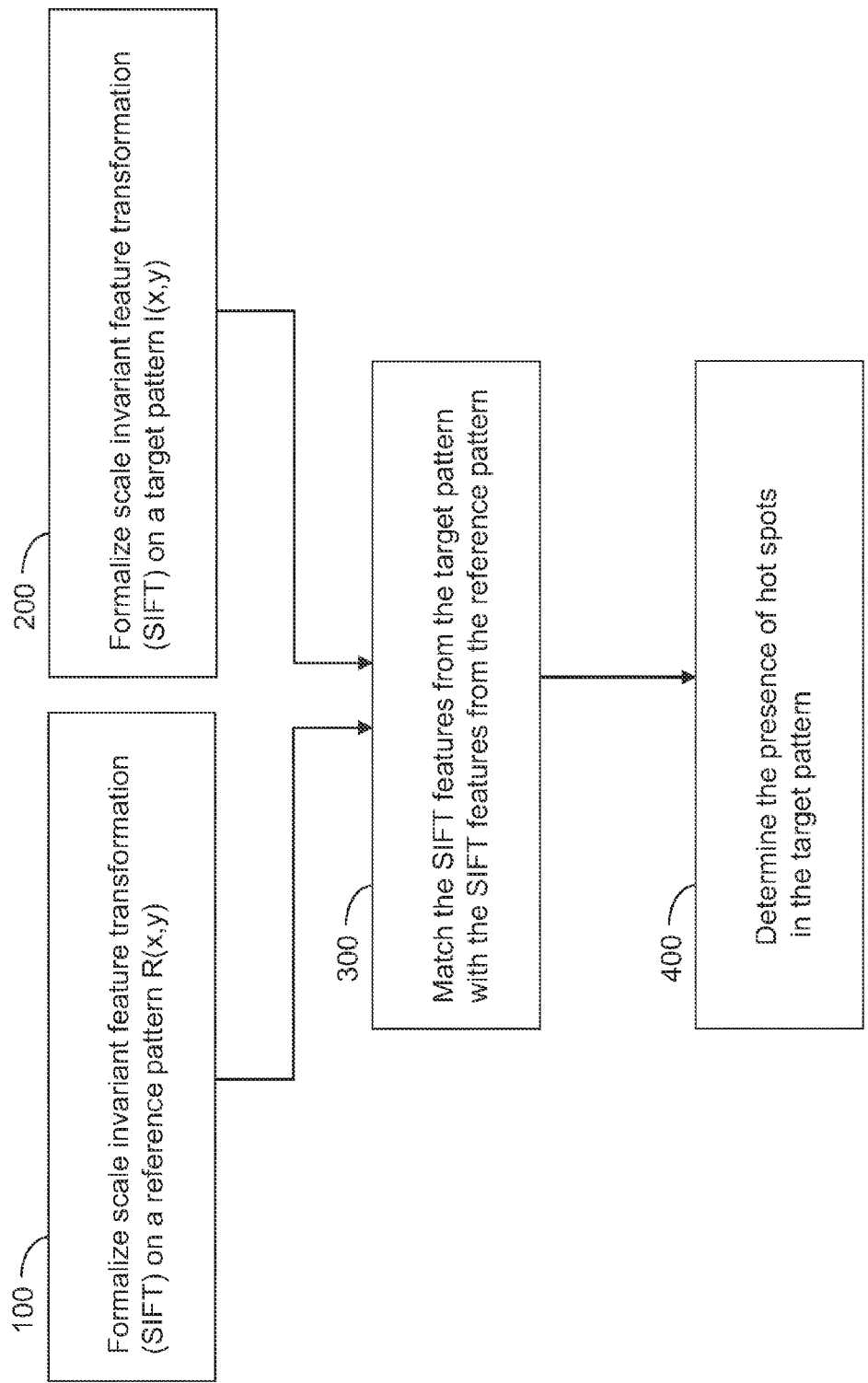
FIG. 1 is a flow chart illustrating the method for determining the presence of hot spots in a target pattern based topological image categorization of layout patterns in the target pattern and a reference pattern.

As stated above, the present disclosure relates to methods of identifying lithographic hot spots in a chip design layout and a system for implementing the same, which are now described in detail with accompanying figures. Like and corresponding elements mentioned herein and illustrated in the drawings are referred to by like reference numerals. The drawings are not necessarily drawn to scale.

A method for prioritization and prediction of lithographic hotspots in a chip design layout in a technology node utilizes learning on patterns including lithographic hot spots in a prior technology node. This method employs unsupervised topological image categorization approach to match layout patterns in two different technology nodes employing different minimum dimensions. For example, data on lithographic hot spots in layout patterns at 45 nm node can be employed to determine the presence of lithographic hot spots in a chip design layout including layout patters at 32 nm node.

The method of the present disclosure can recognize different instances of hotspot patterns of the same object category using an unsupervised approach, which can be performed by running an automatic program on at least one computing means such as a computer. As used herein, a computing means refers to any means capable of running an automated program, and includes, but is not limited to, a personal computer, a portable computer or a "laptop" computer, a server, a virtual machine functioning as a terminal in combination with a server, any portable device capable of running automated programs such as cellular phones provided with the capability to run programs, or any other computing device yet to be invented.

The method of the present disclosure can apply object recognition to design patterns present in chip design layouts that are employed to manufacture semiconductor chips. Thus, hotspots depicting different instances of the same pattern category can be matched. Further, if the printability of an instance of a pattern category is known, the printability of a matched pattern including a hot spot can be predicted. The pattern matching can be used to predict the presence of hot spots in a chip design layout. The pattern matching relies on existing known fault analysis data to identify the structures or geometries of high probability of failure, i.e., hot spots in the chip design layout.

Variations in the shapes and appearances of hot spots introduce difficulty in matching different object instances. In one embodiment of the present disclosure, scale invariant feature transformation (SIFT) is employed to enable matching to two hot spots containing different object instances that are captured from different viewpoints or imaged at different scales or at different spatial locations.

In one embodiment of the present disclosure, an unsupervised pattern recognition employing scale invariant feature transform (SIFT) feature can be used to avoid using pre-labeled samples or error markers in reference patterns.

Referring to FIG. 1, a flow chart illustrates the method for determining the presence of hot spots in a target pattern based topological image categorization of layout patterns in the target pattern and a reference pattern according to an embodiment of the present disclosure. This method can be employed to identify lithographic hot spots in a chip design layout.

Referring to step 100, a set of reference feature key points is generated by performing a first scale invariant feature transformation (SIFT) on a reference pattern including a lithographic hot spot and located in a first chip design layout. This step can be performed by a programmed processor device running an automated program on at least one computing means.

Referring to FIG. 2, step 100 in FIG. 1 can include a set of steps including steps 110, 120, and 130. Referring to step 110, a set of first layout patterns including lithographic hot spots are provided in a memory storage device, e.g., organized as a database. The set of first layout patterns can be provided, for example, by at least one first chip design layout including previously identified hot spots. Specifically, each first layout pattern can be selected to include at least one lithographic hot spot from the at least one first chip design layout. The set of first layout patterns includes layout patterns at a first technology node employing a first minimum lithographic dimension and including lithographic hot spots. The database is in communication with at least one computing means configured to load and analyze the set of first layout patterns. The set of first layout patterns can be sequentially employed to determine the presence or absence of lithographic hot spots having the same topological features as the first layout pattern in a new chip design layout, which is herein referred to as a second chip design layout.

The reference pattern can be provided by selecting a layout pattern from the set of first layout patterns. Thus, the reference pattern is a pattern at the first technology node, and includes known lithographic hot spots at the first technology node. The reference pattern can be represented by a function defined over a domain. In one embodiment, the domain can be defined employing a two dimensional Cartesian coordinates, in which case the reference function can have the form $R(x, y)$. The domain of the reference function $R(x, y)$ includes all points representing the pixels at which the reference pattern $R(x, y)$ is defined. In one embodiment, the domain of the reference function $R(x, y)$ includes all sets of $(x, y)$ Cartesian coordinates corresponding to the pixels at which the reference pattern is defined.

For example, the reference function $R(x, y)$ can be a grey scale image matrix defined to have a value representing the brightness of the pixel at the corresponding location. In one embodiment, the value representing the brightness of the pixel is between, and including, 0 and 1, and depending on the intensity. For example, the value of 0 can represent a black color and the value of 1 can represent a white color. The different values between 0 and 1 represent different shades of grey colors. R(x, y) represents the intensity image matrix in which each element refers to an image pixel. Depending on the data type, the intensity value can be a floating number between, and including, 0 and 1 with 0 representing the black color and 1 representing the white color in an embodiment in which the data type is double class. The intensity value can be an integer between and including 0 and 255 with 0=black and 255=white in an embodiment in which the data type is uint 8 class.

Referring to step 120, scale invariant feature transformation (SIFT) is performed on the reference function R(x, y). A reference SIFT descriptor is extracted at each pixel to characterize local image structures and to encode contextual information of the layout pattern of the hot spot included in the reference pattern. A reference SIFT descriptor is a set of at least one function that describes features of SIFT on the reference pattern and can be stored in a memory storage device in communication with a programmed processor device in a computing means.

In one embodiment, a set of reference SIFT descriptors can include reference difference of Gaussian (DoG) function $D_R$ derived from the reference function R(x, y) representing the reference pattern. The reference DoG function $D_R$ is a parameterized function defined over the domain of the reference function R(x, y). A parameter a, which is herein referred to as a sigma parameter, is employed as a transformation parameter in a transformation that generates the reference DoG function $D_R(x, y, \sigma)$. A parameterized product function $L_R(x, y, \sigma)$ can be defined as the convolution (represented by the operator symbol of *) of the reference function R(x, y) and a parameterized Gaussian function $G(x, y, \sigma)$. Specifically, the reference DoG function $D_R(x, y, \sigma)$ can be defined as:

$$D_R(x, y, \sigma) = L_R(x, y, k\sigma) - L_R(x, y, \sigma);$$

$$L_R(x, y, \sigma) = G(x, y, \sigma) * R(x, y);$$

$$G(x, y, \sigma) = \frac{1}{2\pi\sigma^2} e^{-\frac{x^2+y^2}{2\sigma^2}};$$

$$L_R(x, y, k\sigma) = G(x, y, k\sigma) * R(x, y);$$

$$G(x, y, k\sigma) = \frac{1}{2\pi k^2 \sigma^2} e^{-\frac{x^2+y^2}{2k^2\sigma^2}}.$$

The set of reference SIFT descriptors can further include a reference image orientation function $\theta_R(x, y)$ and a reference gradient magnitude function $m_R(x, y)$, which can be generated from the reference function R(x, y).

In one embodiment, in order to generate the reference image orientation function $\theta_R(x, y)$ and the reference gradient magnitude function $m_R(x, y)$, a value is selected for the sigma parameter a of the reference DoG function $D_R(x, y, \sigma)$. The value of the sigma parameter a can be selected to maximize the likelihood of finding topological correlation between the reference pattern and a target pattern to be subsequently provided. If the reference pattern is a layout pattern at a first technology node employing a first minimum lithographic dimension, and if the target pattern to be subsequently provided is a layout pattern at a second technology node employing a second minimum lithographic dimension, the value of sigma can be selected to be a first fixed value that does not deviate from the ratio of a minimum dimension in the reference pattern to a minimum dimension in the target pattern by more than 20%. In one embodiment, the value of sigma can be selected to be a first fixed value that does not deviate from the ratio of a minimum dimension in the reference pattern to a minimum dimension in the target pattern by more than 10%. In another embodiment, the value of sigma can be selected to be a first fixed value that does not deviate from the ratio of a minimum dimension in the reference pattern to a minimum dimension in the target pattern by more than 5%.

The selected first fixed value of the sigma parameter for the reference DoG function $D_R(x, y, \sigma)$ is herein referred to as $\sigma_R$. The subset of the reference DoG function $D_R(x, y, \sigma)$ in which the value of the sigma parameter $\sigma$ is fixed at $\sigma_R$ is herein referred to as $D_{R\_\sigma_R}(x, y)$, i.e., $D_{R\_\sigma_R}(x, y) = D_R(x, y, \sigma_R)$.

The reference image orientation function $\theta_R(x, y)$ and the reference gradient magnitude function $m_R(x, y)$ can be derived from the reference function R(x, y) and variants of the parameterized product function $L_R(x, y, \sigma)$ in which the sigma parameter $\sigma$ is set at the first fixed value $\sigma_R$. For example, the reference image orientation function $\theta_R(x, y)$ and the reference gradient magnitude function $m_R(x, y)$ can be defined as:

$$\theta_R(x, y) = \tan^{-1}\left(\frac{L_R(x, y+1, \sigma_R) - L_R(x, y-1, \sigma_R)}{L_R(x+1, y, \sigma_R) - L_R(x-1, y, \sigma_R)}\right);$$

$$m_R(x, y) = \sqrt{\begin{array}{l}(L_R(x, y+1, \sigma_R) - L_R(x, y-1, \sigma_R))^2 + \\ (L_R(x+1, y, \sigma_R) - L_R(x-1, y, \sigma_R))^2\end{array}}.$$

Referring to step 130, a set of reference feature key points are located, for example, by computing the extrema of the reference DoG function $D_R(x, y, \sigma)$ in which the value of the sigma parameter $\sigma$ is fixed at $\sigma_R$, i.e., by computing the extrema of the function $D_{R\_\sigma_R}(x, y)$. The extrema of the function $D_{R\_\sigma_R}(x, y)$ can be determined, for example, by differentiating the function $D_{R\_\sigma_R}(x, y)$ with respect to the x coordinate and with respect to the y coordinate and by locating the (x, y) coordinates at which both differentials become zero. The set of reference feature key points include (x, y) coordinates at which the function $D_{R\_\sigma_R}(x, y)$ has extrema in the (x, y) Cartesian coordinate system representing the domain of the reference function R(x, y). Thus, the extrema of the reference DoG function $D_R(x, y, \sigma)$ are determined as a function of two-dimensional coordinates in the reference function R(x, y) by setting the value of the sigma parameter $\sigma$ at the first fixed value $\sigma_R$.

Referring back to FIG. 1 at step 200, a set of target feature key points is generated by performing a second scale invariant feature transformation (SIFT) on a target pattern. This step can be performed by running an automated program on at least one computing means, which can be the same as, or different from, the at least one computing means employed to perform step 100.

The target pattern can be provided from a second design layout at a second technology node having a second minimum lithographic dimension. For example, the target pattern can be generated by dividing the second chip design layout into layout patterns having a size that can be computationally manipulated for the purpose of determining presence or absence of matches in topological features with a selected reference pattern, which can be selected one at a time from the at least one first chip design layout.

Referring to FIG. 3, step 200 in FIG. 1 can include a set of steps including steps 210, 220, and 230. Referring to step 210, a set of second layout patterns are provided in a database. The set of second layout patterns can be generated, for example, by dividing a chip layout design at a second technology node employing a second minimum lithographic dimension. The second technology node may be a more advanced technology node than the first technology node, and the second minimum lithographic dimension may be a smaller dimension than the first minimum lithographic dimension. The set of second layout patterns can collectively include all portions of the chip design layout that potentially includes any lithographic hot spot, and may include all contents of the chip design layout. The database is in communication with at least one computing means configured to load and analyze the set of first layout patterns.

The target pattern can be provided by selecting a layout pattern from the set of second layout patterns. Thus, the target pattern is a pattern at the second technology node. The target pattern can be represented by a function defined over a domain. In one embodiment, the domain can be defined employing a two dimensional Cartesian coordinates, in which case the target function can have the form I(x, y). The domain of the target function I(x, y) includes all points representing the pixels at which the target pattern I(x, y) is defined. In one embodiment, the domain of the target function I(x, y) includes all sets of (x, y) Cartesian coordinates corresponding to the pixels at which the target pattern is defined.

For example, the target function I(x, y) can be a grey scale image matrix defined to have a value representing the brightness of the pixel at the corresponding location. In one embodiment, the value representing the brightness of the pixel is between, and including, 0 and 1, and depending on the intensity. For example, the value of 0 can represent a black color and the value of 1 can represent a white color. The different values between 0 and 1 represent different shades of grey colors. I(x, y) represents the intensity image matrix in which each element refers to an image pixel. Depending on the data type, the intensity value can be a floating number between, and including, 0 and 1 with 0 representing the black color and 1 representing the white color in an embodiment in which the data type is double class. The intensity value can be an integer between and including 0 and 255 with 0=black and 255=white in an embodiment in which the data type is uint 8 class.

Referring to step 220, scale invariant feature transformation (SIFT) is performed on the target function I(x, y). A target SIFT descriptor is extracted at each pixel to characterize local image structures and to encode contextual information of the layout pattern in the target pattern. A target SIFT descriptor is a set of at least one function that describes features of SIFT on the target pattern that can be stored in a memory storage device in communication with a programmed processor device in a computing means.

In one embodiment, a set of target SIFT descriptors can include target difference of Gaussian (DoG) function $D_I$ derived from the target function I(x, y) representing the target pattern. The target DoG function $D_I$ is a parameterized function defined over the domain of the target function I(x, y). Another sigma parameter σ is employed as a transformation parameter in a transformation that generates the target DoG function $D_I(x, y, \sigma)$. A parameterized product function $L_I(x, y, \sigma)$ can be defined as the convolution of the target function I(x, y) and a parameterized Gaussian function G(x, y, σ). Specifically, the target DoG function $D_I(x, y, \sigma)$ can be defined as:

$$D_I(x, y, \sigma) = L_I(x, y, k\sigma) - L_I(x, y, \sigma);$$

$$L_I(x, y, \sigma) = G(x, y, \sigma) * I(x, y);$$

-continued $$G(x, y, \sigma) = \frac{1}{2\pi\sigma^2} e^{-\frac{x^2+y^2}{2\sigma^2}};$$

$$L_I(x, y, k\sigma) = G(x, y, k\sigma) * I(x, y);$$

$$G(x, y, k\sigma) = \frac{1}{2\pi k^2 \sigma^2} e^{-\frac{x^2+y^2}{2k^2\sigma^2}}.$$

The set of target SIFT descriptors can further include a target image orientation function $\theta_I(x, y)$ and a target gradient magnitude function $m_I(x, y)$, which can be generated from the target function I(x, y).

In one embodiment, in order to generate the target image orientation function $\theta_I(x, y)$ and the target gradient magnitude function $m_I(x, y)$, a value is selected for the sigma parameter σ of the target DoG function $D_I(x, y, \sigma)$. The value of the sigma parameter σ can be selected to maximize the likelihood of finding topological correlation between the target pattern and a target pattern to be subsequently provided. If the target pattern is a layout pattern at a first technology node employing a first minimum lithographic dimension, and if the target pattern to be subsequently provided is a layout pattern at a second technology node employing a second minimum lithographic dimension, the value of sigma can be selected to be a second fixed value that does not deviate from the ratio of a minimum dimension in the target pattern to a minimum dimension in the target pattern by more than 20%. In one embodiment, the value of sigma can be selected to be a second fixed value that does not deviate from the ratio of a minimum dimension in the target pattern to a minimum dimension in the target pattern by more than 10%. In another embodiment, the value of sigma can be selected to be a second fixed value that does not deviate from the ratio of a minimum dimension in the target pattern to a minimum dimension in the target pattern by more than 5%. In one embodiment, the second fixed value can be the same as the first fixed value.

The minimum dimension can be a minimum pitch, minimum line width, minimum space, or any comparable lithographic metric employed for printability of lithographic features as known in the art. As an illustrative example, if the reference pattern is a layout pattern having a minimum pitch of 52 nm, and if the target pattern is a layout pattern having a minimum pitch of 40 nm, the first fixed value and the second fixed value for the sigma parameters can be within 20% of the ratio of 52 nm to 40 nm, i.e., between 1.1 and 1.5. In one embodiment, the first fixed value and the second fixed value for the sigma parameters can be between 1.2 and 1.4. In another embodiment, in one embodiment, the first fixed value and the second fixed value for the sigma parameters can be between 1.25 and 1.35. As another illustrative example, if the reference pattern is a layout pattern having a minimum line width of 32 nm, and if the target pattern is a layout pattern having a minimum line width of 22 nm, the first fixed value and the second fixed value for the sigma parameters can be within 20% of the ratio of 32 nm to 22 nm, i.e., between about 1.2545 and 1.6545. In one embodiment, the first fixed value and the second fixed value for the sigma parameters can be between 1.3525 and 1.5545. In another embodiment, the first fixed value and the second fixed value for the sigma parameters can be between 1.4025 and 1.5025.

The selected second fixed value of the sigma parameter for the target DoG function $D_I(x, y, \sigma)$ is herein referred to as $\sigma_I$. The subset of the target DoG function $D_I(x, y, \sigma)$ in which the value of the sigma parameter σ is fixed at $\sigma_I$ is herein referred to as $D_{I\_\sigma_I}(x, y)$, i.e., $D_{I\_\sigma_I}(x, y) = D_I(x, y, \sigma_I)$.

The target image orientation function $\theta_I(x, y)$ and the target gradient magnitude function $m_I(x, y)$ can be derived from the target function $I(x, y)$ and variants of the parameterized product function $L_I(x, y, \sigma)$ in which the sigma parameter $\sigma$ is set at the second fixed value $\sigma_I$. For example, the target image orientation function $\theta_I(x, y)$ and the target gradient magnitude function $m_I(x, y)$ can be defined as:

$$\theta_I(x, y) = \tan^{-1}\left(\frac{L_I(x, y+1, \sigma_I) - L_I(x, y-1, \sigma_I)}{L_I(x+1, y, \sigma_I) - L_I(x-1, y, \sigma_I)}\right);$$

$$m_R(x, y) = \sqrt{\begin{array}{l}(L_I(x, y+1, \sigma_I) - L_I(x, y-1, \sigma_I))^2 + \\ (L_I(x+1, y, \sigma_I) - L_I(x-1, y, \sigma_I))^2\end{array}}.$$

Referring to step 230, a set of target feature key points are located, for example, by computing the extrema of the target DoG function $D_I(x, y, \sigma)$ in which the value of the sigma parameter $\sigma$ is fixed at $\sigma_I$, i.e., by computing the extrema of the function $D_{I\_\sigma_I}(x, y)$. The extrema of the function $D_{I\_\sigma_I}(x, y)$ can be determined, for example, by differentiating the function $D_{I\_\sigma_I}(x, y)$ with respect to the x coordinate and with respect to the y coordinate and by locating the (x, y) coordinates at which both differentials become zero. The set of target feature key points include (x, y) coordinates at which the function $D_{I\_\sigma_I}(x, y)$ has extrema in the (x, y) Cartesian coordinate system representing the domain of the target function I(x, y). Thus, the extrema of the target DoG function $D_I(x, y, \sigma)$ are determined as a function of two-dimensional coordinates in the target function I(x, y) by setting the value of the sigma parameter s at the first fixed value $\sigma_R$.

Referring to step 300 in FIG. 1, the set of reference feature key points are matched with the set of target feature key points employing at least one computing means, which can be the same as, or different from, the at least one computing means employed to perform the steps 100 and 200. The set of reference feature key points can be matched with the set of target feature key points, for example, by identifying pairs of feature key points across the set of reference feature key points and the set of target feature key points. Each of the pairs are selected to provide maximum matching between topological features of the set of reference feature key points and topological features of the set of target feature key points.

In one embodiment, the topological features of the set of reference feature key points can be characterized by a set of reference scale invariant feature transformation (SIFT) descriptors, and the topological features of the set of target feature key points can be characterized by a set of target scale invariant feature transformation (SIFT) descriptors.

In one embodiment, the set of reference SIFT descriptors can be a set of first three component vectors, i.e., the topological features of the set of target feature key points can be characterized by the set of second three component vectors. Each set of first three component vectors includes a value of the reference DoG function $D_R(x, y, \sigma)$ in which the sigma parameter is set at the first fixed value $\sigma_R$, a value of the reference image orientation function $\theta_R(x, y)$, and a value of the reference gradient magnitude function $m_R(x, y)$. All three values in each first three component vector are evaluated at the same reference feature key point that is selected among the set of reference feature key points. The set of first three component vectors includes vectors corresponding to each reference feature key point in the set of reference feature key points.

Likewise, the set of target SIFT descriptors can be a set of second three component vectors, i.e., the topological features of the set of target feature key points can be characterized by the set of second three component vectors. Each set of first three component vectors includes a value of the target DoG function $D_I(x, y, \sigma)$ in which the sigma parameter is set at the second fixed value $\sigma_I$, a value of the target image orientation function $\theta_I(x, y)$, and a value of the target gradient magnitude function $m_I(x, y)$. All three values in each first three component vector are evaluated at the same target feature key point that is selected among the set of target feature key points. The set of second three component vectors includes vectors corresponding to each target feature key point in the set of target feature key points.

Figure 4:
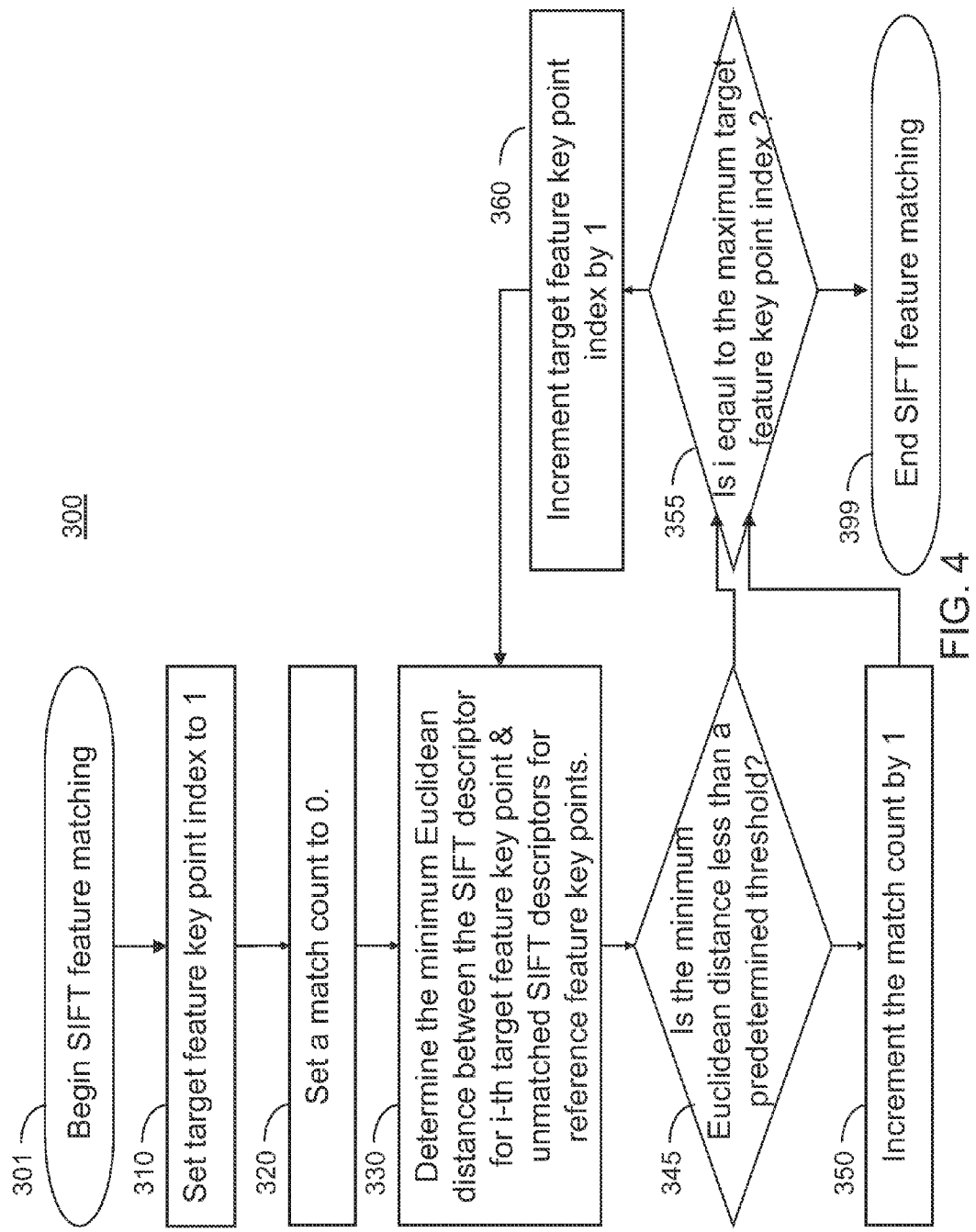
FIG. 4 is a flow chart illustrating the method for matching the target SIFT features and the reference SIFT features.

Step 300 in FIG. 1 can be implemented, for example, by performing a set of steps in the flow chart in FIG. 4 in one embodiment to the present disclosure. In other words, the steps in the flow chart in FIG. 4 can be employed to match the set of reference feature key points with the set of target feature key points. The set of steps in the flow chart of FIG. 4 can be performed, for example, by employing a computing device, a programmed processor device, e.g., a computing element.

Referring to step 301, SIFT feature matching can begin by generating a first set of parameters that characterize the topographical features of the reference pattern as parameterized at each reference feature key point and a second set of parameters that characterize the topographical features of the target pattern as parameterized at each target feature key point. For example, the first set of parameters can be the set of reference SIFT descriptors, and the second set of parameters can be the set of target SIFT descriptors.

Each reference feature key point in the set of reference feature key points can be indexed, for example, from 1 to the total number $N_R$ of reference feature key points in the set of reference feature key points. Likewise, each target feature key point in the set of target feature key points can be indexed, for example, from 1 to the total number $N_I$ of target feature key points in the set of target feature key points.

In one embodiment, the reference feature key points can be sorted in the order of decreasing magnitude for the value of the reference gradient magnitude function $m_R(x, y)$, and the target feature key points can be sorted in the order of decreasing magnitude for the value of the gradient magnitude function $m_I(x, y)$.

Depending on the area of selected for the reference pattern and the target pattern, and depending on the complexity of the pattern layout in each of the reference pattern and the target pattern, the total number $N_R$ of reference feature key points and the total number $N_I$ of target feature key points can be from 5 to 10,000, and typically from 25 to 500, although lesser and greater numbers can also be employed depending on computational capabilities of at least one computing means employed to determine the reference feature key points and the target feature key points.

In one embodiment, a first three component vectors described above represents the topological features of the reference pattern around each reference feature key point, and a second three component vectors described above represents the topological features of the target pattern around each target feature key point.

Referring to step 310, a program running on at least one computing means sets a target feature key point index to 1 to enable systematic matching of the first three component vectors with the second three component vectors in subsequent steps.

Referring to step 320, a match count is set to 0 to indicate that no matching pair has been found prior to steps that perform the matching between the first three component vectors with the second three component vectors.

Referring to step 330, the value i of the target feature key point index is identified, and the minimum Euclidean distance is determined between the i-th target SIFT descriptor, i.e., the target SIFT descriptor for the i-th target feature key point, and unmatched reference SIFT descriptors. During the first pass through step 330, all reference SIFT descriptors are unmatched reference SIFT descriptors. Once any reference SIFT descriptor is matched with a target SIFT descriptor, such reference SIFT descriptors are labeled as matched reference SIFT descriptors, and the number of unmatched reference SIFT descriptor is decremented by one to exclude the newly matched reference SIFT descriptor.

The determination of the minimum Euclidean distance between the i-th target SIFT descriptor and the unmatched reference SIFT descriptors can be performed by sequentially determining the distance within the three dimensional Euclidean space between the i-th target SIFT descriptor ($D_{I\_}\sigma_I(x, y)$, $\theta_I(x, y)$, $m_I(x, y)$) for the i-th target feature key point and each unmatched SIFT descriptor ($D_{R\_}\sigma_R(x, y)$, $\theta_R(x, y)$, $m_R(x, y)$) for the reference feature key points, and subsequently selecting the unmatched SIFT descriptor ($D_{R\_}\sigma_R(x, y)$, $\theta_R(x, y)$, $m_R(x, y)$) that provides the least Euclidean distance to the i-th target SIFT descriptor.

Referring to step 345, the minimum Euclidean distance between the i-th target SIFT descriptor and the unmatched reference SIFT descriptors as determined at step 330 is compared with a predetermined threshold. The predetermined threshold is a real positive scalar, i.e., a real positive number. The predetermined threshold determines the required level of similarity between first topological features and second topological features to identify the two sets of topological features as matched. The first topological features are the topological features around the i-th target feature key point associated with the i-th target SIFT descriptor, and the second topological features are the topological features around the reference feature key point corresponding to the reference SIFT descriptor that provided the least Euclidean distance during the latest pass through step 330.

If the minimum Euclidean distance between the i-th target SIFT descriptor and the unmatched reference SIFT descriptors is greater than the predetermined threshold, the i-th target SIFT descriptor and the reference SIFT descriptor providing the minimum Euclidean distance as determined at step 340 are matched. Correspondingly, the i-th target feature key point is matched with the reference feature key point corresponding to the reference SIFT descriptor that provided the least Euclidean distance during the latest pass through step 330.

In this case, the process flow then proceeds to step 350. The match count is incremented by 1, and the reference SIFT descriptor that provided the least Euclidean distance during the latest pass through step 330 is labeled as a matched reference SIFT descriptor, i.e., excluded from the set of unmatched SIFT descriptors. The process flow then proceeds to step 355.

If the minimum Euclidean distance between the i-th target SIFT descriptor and the unmatched reference SIFT descriptors is not greater than the predetermined threshold, the i-th target SIFT descriptor and the reference SIFT descriptor providing the minimum Euclidean distance as determined at step 340 are not matched. Thus, no change is made to the match count, and the reference SIFT descriptor that provided the least Euclidean distance during the latest pass through step 330 remains as an unmatched SIFT descriptor. In this case, the process flow proceeds from step 345 directly to step 355.

Referring to step 355, the value i of the target feature key point index is compared with the maximum value for the target feature key point index, which is equal to the total number $N_I$ of target feature key points in the set of target feature key points. If the value i is less than the maximum value for the target feature key point index, the process flow proceeds to step 360.

At step 360, the target feature key point index is incremented by 1. The process flow then proceeds to step 330 to determine the minimum Euclidean distance for the target SIFT descriptor having the incremented target feature key point index.

By looping through steps 330, 345, 355, 360, and optionally through step 350, matched pairs are determined between the elements of the set of target SIFT descriptors and the elements of the set of the reference SIFT descriptors. Each pair is selected to minimize a Euclidean distance between a corresponding first three component vector and a corresponding second three component vector among all possible combinations of a previously unmatched first three component vector and a previously unmatched second three component vector.

If the value i is equal to the maximum value for the target feature key point index, the process flow proceeds to step 399. At step 399, the process of SIFT feature matching is terminated.

Referring to step 400 in FIG. 1, a determination is made as to whether the target pattern includes lithographic hot spots. A pattern score filtering rule can be employed to determine a total number of matches between the set of reference feature key points and the set of target feature key points is greater than a predetermined number μ. The total number of matches is the match count at the time of termination of the process of SIFT feature matching, e.g., at step 399 in FIG. 4.

Specifically, if the total number of matches is equal to or greater than the predetermined number μ, the target pattern includes at least one hot spot. If the total number of matches is less than the predetermined number μ, the target pattern does not include a hot spot.

In one embodiment, data representing a result of the matching can be stored in a non-transitory machine readable data storage medium employing the at least one computing means. The stored data represents presence of at least one lithographic hot spot in the target pattern.

In one embodiment, the data can be stored in a form of a netlist or in a data format used for the exchange of layout data of integrated circuits.

In one embodiment, at least one marker layer can be added to the second chip design layout. Each of the at least one marker layer represents locations of the at least one lithographic hot spot in the target pattern in the second chip design layout.

In one embodiment, at least one computing means can be employed to run a program that automatically corrects features in the at least one lithographic hot spot based on a pre-programmed algorithm.

By employing the methods described above, a set of visually similar hotspot patterns can be identified through comparison of reference SIFT descriptors and target SIFT descriptors in each query that employs a reference pattern selected from the at least one chip design layout and a target pattern selected from the second chip design layout.

Once the printability of matched patterns is known, time and other resources can be allocated for developmental work in the area of computational lithography according to the level of severity of the printability problems in the matched hot spots. By focusing invested time and design resources on the identified hot spots in the chip design layout, technology development time and cost can be reduced for a new technology node employing a smaller minimum dimension than existing technology nodes.

The method of the present disclosure employs the unsupervised topological image categorization approach in order to recognize complex product geometries which have high probability failure rate during fabrication. The unsupervised topological image categorization approach can be employed to automatically recognize lithographic error-prone patterns from a chip design layout.

In one embodiment, the unsupervised topological image categorization approach can be implemented without any labeled samples or error marker for reference patterns. In this regard, the unsupervised topological image categorization approach provides more flexibility and robustness for the prediction of hot spots since labeled samples may not be available or reasonably expected good for analysis.

The unsupervised topological image categorization approach of the present disclosure is also useful when a new chip design layout in a new technology node is being developed. In this case, any past experience on hot spots or any patterns of interest identified from previous designs and fault analysis in a preceding technology node can be utilized to recognize problematic patterns in the new chip design layout. Thus, hot spot regions in a target layout can be identified using lithographic data from prior generation technology and/or fault analysis thereupon. The unsupervised topological image categorization approach can handle variations in the shapes and appearances of hot spots, and recognize different instances of hot spot patterns in the same category notwithstanding the minor variations in shape, orientation, or otherwise appearance-affecting variations that may not be intuitively detected by human inspection.

Figure 6:
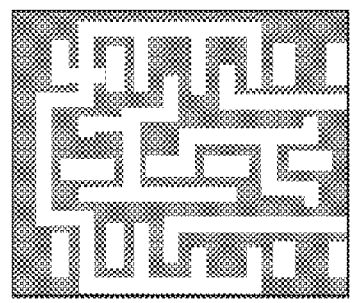
FIG. 6 is a view of a first exemplary target pattern.
Figure 5:
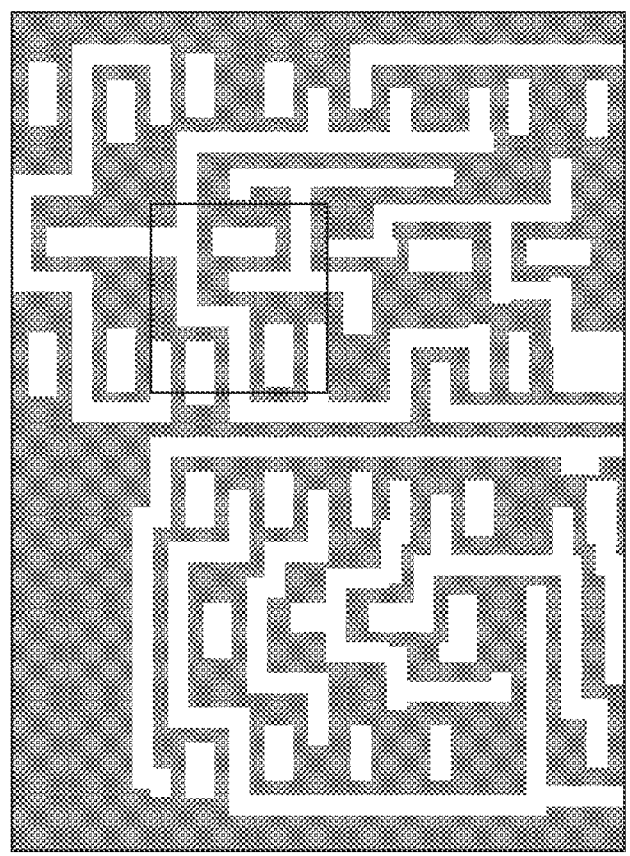
FIG. 5 is a view of a first exemplary reference pattern including hot spots.

In one embodiment, the reference pattern and the target pattern can represent a set of line structures configured to provide lateral electrically conductive paths in a semiconductor chip. Referring to FIGS. 5 and 6, a pair of a target pattern and a reference pattern is shown. Specifically, FIG. 5 is a view of a first exemplary reference pattern. The first exemplary reference pattern is known to include a hot spot within an area indicated by a rectangle. FIG. 6 is a view of a first exemplary target pattern.

Employing the methods described above, the first exemplary target pattern is found to have a total number of matches that is greater than a predetermined number $\mu$ between the set of target feature key points determined therefrom and the set of reference feature key points determined from the first exemplary reference pattern. In other words, the first exemplary target pattern is found to have at least one lithographic hot spot.

In one embodiment of the present disclosure, at least one region in the target pattern can be identified that generates a greater areal density of matches between a set of during the matching than the rest of the target pattern. Specifically, at least one sub-target pattern having a total area less than the total area of the target pattern and including a region of the target pattern can be generated. Further, at least another set of target feature key points can be generated by performing an additional SIFT on each of the at least one sub-target pattern.

Steps 100, 200, 300, and 400 can be employed to modify the stored data to enhance printability of the chip design layout employing at least one computing means. Once the areas for lithographic hot spots are identified, any algorithm known in the art can be employed to enhance the printability of the lithographic hot spots. By identifying the areas for lithographic hot spots, the present disclosure allows concentration of the computing power and time to enhance the printability of the lithographic hot spots instead of attempting to increase the general printability of the chip design layout without focusing resources in the computing power and time. The methods of the present disclosure can be employed to print a lithographic image on a semiconductor substrate employing a modified chip design layout, which is modified to enhance the printability of the area of the lithographic hot spots identified employing steps 100, 200, 300, and 400.

Figure 7B:
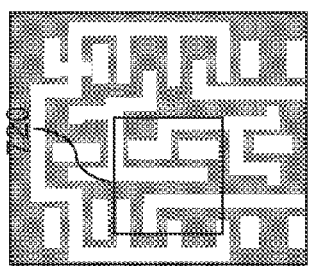
FIG. 7B is a view of the first exemplary target pattern in which a first non-matched region is shown in a rectangle.
Figure 7D:
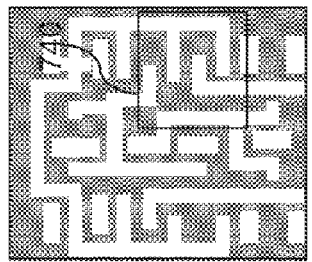
FIG. 7D is a view of the first exemplary target pattern in which a third non-matched region is shown in a rectangle.
Figure 7A:
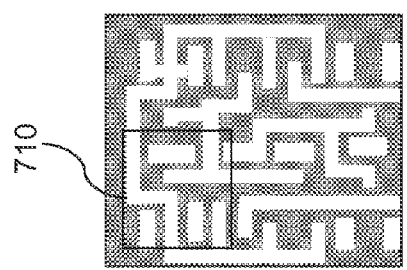
FIG. 7A is a view of the first exemplary target pattern in which a hot spot is identified according to a method of the present disclosure.
Figure 7C:
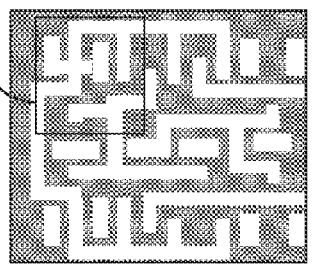
FIG. 7C is a view of the first exemplary target pattern in which a second non-matched region is shown in a rectangle.

Referring to FIGS. 7A-7C, examples of generating at least one sub-target pattern are illustrated. In FIG. 7A, a first sub-region 710 including a first sub-target pattern enclosed in a rectangle is shown. In FIG. 7B, a second sub-region 720 including a second sub-target pattern enclosed in a rectangle is shown. In FIG. 7C, a third sub-region 730 including a third sub-target pattern enclosed in a rectangle is shown. In FIG. 7D, a fourth sub-region 740 including a fourth sub-target pattern enclosed in a rectangle is shown.

The set of reference feature key points can be matched with the at least another set of target feature key points by identifying pairs of feature key points across the set of reference feature key points and the at least another set of target feature key points across the first exemplary reference pattern in FIG. 5 and the various sub-target patterns in the sub-regions (710, 720, 530, 740) in FIGS. 7A-7D. Each of the pairs are selected to provide maximum matching between topological features of the set of reference feature key points and topological features of the at least another set of target feature key points.

The generation of the at least one sub-target pattern can be iteratively performed to reduce the area of the region identified to have include at least one lithographic hot spot. In this case, a first sub-target pattern can be generated by reducing an area of the target pattern, and each of the at least one sub-target pattern other than the first sub-target pattern can be generated iteratively by successively reducing an area of an immediately preceding sub-target pattern.

Figure 9:
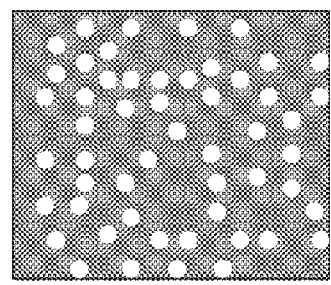
FIG. 9 is a view of a second exemplary target pattern.
Figure 8:
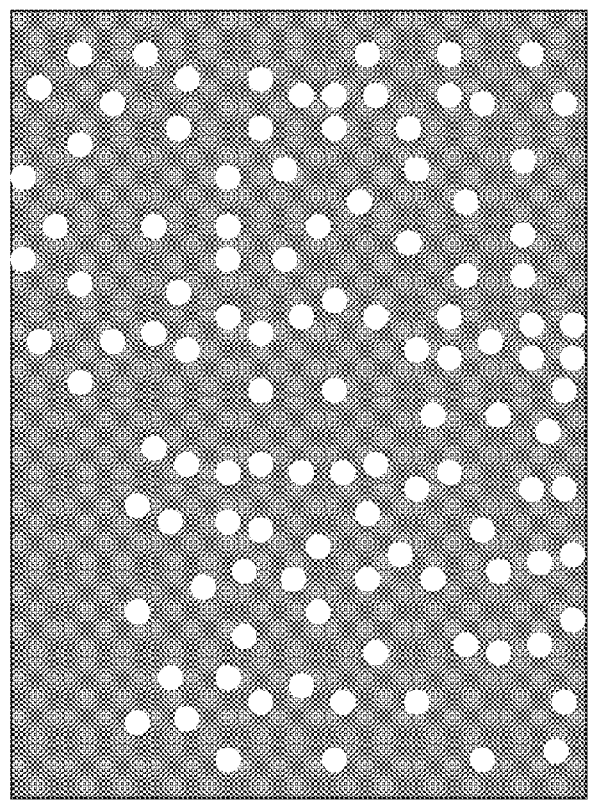
FIG. 8 is a view of a second exemplary reference pattern that is known to include a hot spot.

Referring to FIGS. 8 and 9, the reference pattern and the target pattern can represent a set of contact via structures configured to provide vertical electrically conductive paths in a semiconductor chip. FIG. 8 is a view of a second exemplary reference pattern that is known to include a hot spot among the array of the patterns representing contact via structures. FIG. 9 is a view of a second exemplary target pattern including an array of the patterns representing contact via structures.

Figure 10:
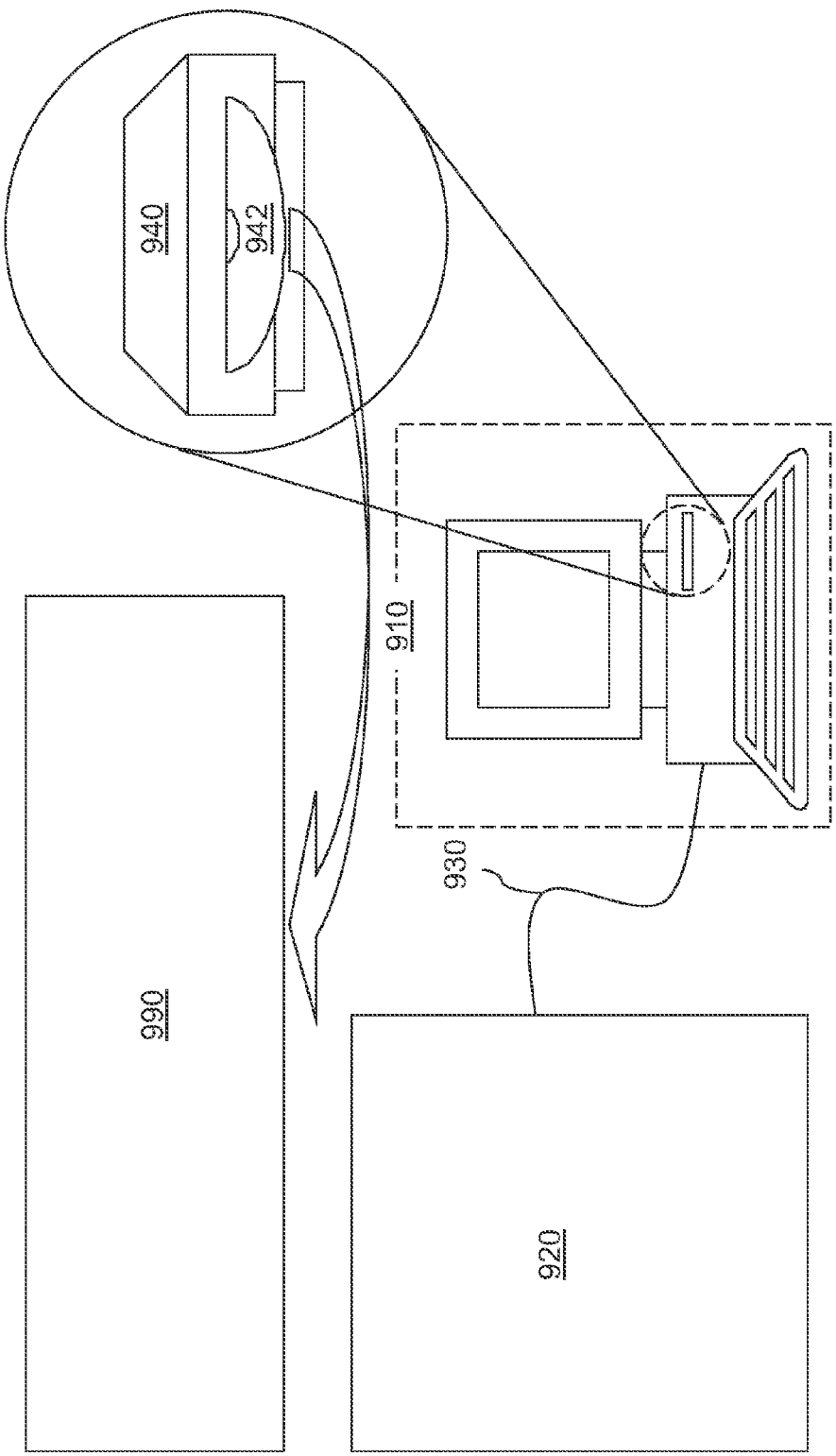
FIG. 10 is an exemplary system for identifying hot spots in a target pattern in a chip design layout based topological image categorization of layout patterns, for modifying the chip design layout to enhance lithographic performance in identified hot spots, and for manufacturing a set of at least one reticle based on the modified chip design layout.

FIG. 10 is an exemplary system for identifying hot spots in a target pattern in a chip design layout based topological image categorization of layout patterns, for modifying the chip design layout to enhance lithographic performance in identified hot spots, and for manufacturing a set of at least one reticle based on the modified chip design layout.

The data representing the modified chip design layout is stored in a non-transitory machine readable storage medium by encoding the data in the non-transitory machine readable storage medium employing data encoding methods known in the art. In one embodiment, the encoded data can be stored in a form of a netlist or in a data format used for the exchange of layout data of integrated circuits.

A set of at least one mask can be manufactured employing the modified chip design layout. The set of at least one mask can be can be manufactured, for example, by transmitting the data representing the third modified chip design layout and stored in a non-transitory machine readable medium to a mask writer by electronic means or by physical transfer of the non-transitory machine readable medium to a device electrically connected to the mask writer and configured to read the data in the non-transitory machine readable medium.

The system in FIG. 10 can be employed to manufacture a set of at least one lithographic mask in which a chip design layout is optimized in regions identified with the unsupervised topographical image categorization method of the present disclosure. The system can include at least one computing means 910, which can include a computer. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910.

The at least one computing means 910 can be employed to perform at least one or all of steps 100, 200, 300, and 400 in FIG. 1 to identify lithographic hot spots in a chip design layout. The at least one computing means 910 can be configured to perform the various steps in FIG. 1 automatically without human intervention once a chip design layout is provided.

Once the lithographic hot spots in the chip design layout are identified, lithographic optimization can be performed on the identified lithographic hot spots employing image correction techniques known in the art. For example, an automated image correction program based on optical proximity correction (OPC) can be run to test alternative design shapes to replace original design shapes. If an improvement in a lithographic performance metric is found, an alternative design shape may replace the original design shape. By iteratively correcting all identified lithographic hot spots, the at least one computing means can generate a modified chip design layout that is superior in lithographic performance to the original chip design layout.

The original chip design layout, the modified chip design layout, and any intermediate chip design layout can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The modified chip design layout is transferred to a mask writing device 990 to enable manufacturing of a set of at least one lithographic mask (reticle) encoding the modified chip design layout. The data transfer to the mask writing device 990 can be effected by a portable non-transitory machine-readable data storage medium 942, a data cable (not shown) or by wireless communication.

The various data employed in the method of the present disclosure can be in any data format used for the exchange of layout data of integrated circuits and/or symbolic data format (e.g. information stored in a GDSII (GDS2), GL1, OASIS, map files, or any other suitable format for storing such design data structures) and can be further converted to grey-scale image format for implementing digital image processing techniques including the described SIFT feature extraction and matching. The various data may comprise information such as, for example, coordinates file in which the location of each converted image corresponding to its original design layout data is recorded, symbolic data, map files, test data files, design content files, layout parameters, and any other data required by a reticle manufacturer to manufacture a set of at least one reticle encoding the third modified chip design layout.

The at least one computing means 910 houses a processor, memory and other systems components (not shown expressly in the drawing) that implement a general purpose processing system, or computer that may execute a computer program product. The computer program product may comprise media, for example a compact storage medium such as a compact disc, which may be read by the processing unit through a disc drive, or by any means known to the skilled artisan for providing the computer program product to the general purpose processing system for execution thereby.

The computer program product may comprise all the respective features enabling the implementation of the inventive method described herein, and which—when loaded in a computer system—is able to carry out the method. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit, as mentioned, or may be located on a remote system such as a server (not shown), coupled to the processing unit, via a network interface such as an Ethernet interface. A monitor, a mouse, a keyboard, and any other human interface device can be coupled to the processing unit, to provide user interaction. A scanner (not shown) and/or a printer (not shown) may be provided for document input and output.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of modifying lithographic hot spots in a chip design layout comprising:
   generating a set of reference feature key points by performing, employing at least one computing means, a first scale invariant feature transformation (SIFT) on a reference pattern including a lithographic hot spot located in a first chip design layout;
   generating a set of target feature key points by performing, employing said at least one computing means, a second SIFT on a target pattern located in a second chip design layout;
   matching said set of reference feature key points with said set of target feature key points by identifying, employing said at least one computing means, pairs of feature key points across said set of reference feature key points and said set of target feature key points, wherein each of said pairs are selected to provide maximum matching between topological features of said set of reference feature key points and topological features of said set of target feature key points; and
   storing data representing a result of said matching in a non-transitory machine readable data storage medium employing said at least one computing means, wherein said stored data represents presence of at least one lithographic hot spot in said target pattern;
modifying said stored data to enhance printability of said chip design layout employing said at least one computing means.

2. The method of claim 1, further comprising determining whether a total number of matches between said set of reference feature key points and said set of target feature key points is greater than a predetermined number.

3. The method of claim 1, further comprising identifying a region in said target pattern that generates a greater areal density of matches during said matching than the rest of said target pattern.

4. The method of claim 3, further comprising:
generating, employing said at least one computing means, at least one sub-target pattern having a total area less than a total area of said target pattern and including said region; and
generating at least another set of target feature key points by performing, employing said at least one computing means, an additional SIFT on each of said at least one sub-target pattern.

5. The method of claim 4, further comprising matching said set of reference feature key points with said at least another set of target feature key points by identifying, employing said at least one computing means, pairs of feature key points across said set of reference feature key points and said at least another set of target feature key points, wherein each of said pairs are selected to provide maximum matching between topological features of said set of reference feature key points and topological features of said at least another set of target feature key points.

6. The method of claim 4, wherein a first sub-target pattern is generated by reducing an area of said target pattern, and each of said at least one sub-target pattern other than said first sub-target pattern is generated iteratively by successively reducing an area of an immediately preceding sub-target pattern.

7. The method of claim 1, wherein said set of reference feature key points is generated by:
generating a reference difference of Gaussian (DoG) function from said reference pattern; and
locating extrema of said reference DoG function as a function of two-dimensional coordinates in said reference function,
and said set of target feature key points is generated by:
generating a target DoG function from said target pattern; and
locating extrema of said target DoG function as a function of two-dimensional coordinates in said target function.

8. The method of claim 7, wherein said extrema of said reference DoG function are determined for a first fixed value of a sigma parameter for said reference DoG function, and said extrema of said target DoG function are determined for a second fixed value of a sigma parameter for said target DoG function, wherein said first fixed value and said second fixed value do not deviate from a ratio of a minimum dimension in said reference pattern to a minimum dimension in said target pattern by more than 20%.

9. The method of claim 8, further comprising:
generating a reference image orientation function and a reference gradient magnitude function from said reference pattern; and
generating a target image orientation function and a target gradient magnitude function from said target pattern, wherein said topological features of said set of reference feature key points are characterized by a set of first three component vectors including a value of said reference DoG function, a value of said reference image orientation function, and a value of said reference gradient magnitude function at each of said reference feature key point in said set of reference feature key points, and said topological features of said set of target feature key points are characterized by a set of second three component vectors including a value of said target DoG function, a value of said target image orientation function, and a value of said target gradient magnitude function at each of said target feature key point in said set of target feature key points.

10. The method of claim 9, wherein said pairs are selected to minimize a Euclidean distance between a corresponding first three component vector and a corresponding second three component vector among all possible combinations of a previously unmatched first three component vector and a previously unmatched second three component vector.

11. The method of claim 1, further comprising adding at least one marker layer to said second chip design layout, wherein each of said at least one marker layer represents locations of said at least one lithographic hot spot in said target pattern in said second chip design layout.

12. The method of claim 11, further comprising running, employing said at least one computing means, a program that automatically corrects features in said at least one lithographic hot spot based on a pre-programmed algorithm.

13. The method of claim 1, wherein said data is stored in a form of a netlist or in a data format used for the exchange of layout data of integrated circuits.

14. The method of claim 1, wherein said reference pattern and said target pattern represent a set of line structures configured to provide lateral electrically conductive paths in a semiconductor chip.

15. The method of claim 1, wherein said reference pattern and said target pattern represent a set of contact via structures configured to provide vertical electrically conductive paths in a semiconductor chip.

16. A system for modifying lithographic hot spots in a chip design layout, said system comprising at least one computing means including a processor, wherein said at least one computing means is configured to perform the steps of:
generating a set of reference feature key points by performing a first scale invariant feature transformation (SIFT) on a reference pattern including a lithographic hot spot and located in a first chip design layout;
generating a set of target feature key points by performing a second SIFT on a target pattern located in a second chip design layout;
matching said set of reference feature key points with said set of target feature key points by identifying pairs of feature key points across said set of reference feature key points and said set of target feature key points, wherein each of said pairs are selected to provide maximum matching between topological features of said set of reference feature key points and topological features of said set of target feature key points;
storing data representing a result of said matching in a non-transitory machine readable data storage medium, wherein said stored data represents presence of at least one lithographic hot spot in said target pattern; and
modifying said stored data to enhance printability of said chip design layout.

17. The system of claim 16, wherein said at least one computing means is configured to perform a further step of determining whether a total number of matches between said set of reference feature key points and said set of target feature key points is greater than a predetermined number.

18. The system of claim 16, wherein said at least one computing means is configured to perform a further step of identifying a region in said target pattern that generates a greater areal density of matches during said matching than the rest of said target pattern.

19. The system of claim 18, wherein said at least one computing means is configured to perform the further steps of:
   generating, employing said at least one computing means, at least one sub-target pattern less than said target pattern and including said region; and
   generating at least another set of target feature key points by performing, employing said at least one computing means, an additional SIFT on each of said at least one sub-target pattern.

20. The system of claim 16, wherein said set of reference feature key points is generated by:
   generating a reference difference of Gaussian (DoG) function from said reference pattern; and
   locating extrema of said reference DoG function as a function of two-dimensional coordinates in said reference function,
and said set of target feature key points is generated by:
   generating a target DoG function from said target pattern; and
   locating extrema of said target DoG function as a function of two-dimensional coordinates in said target function.

* * * * *